United States Patent
Park et al.

[11] Patent Number: 5,837,605
[45] Date of Patent: Nov. 17, 1998

[54] MANUFACTURING METHOD OF TRANSISTORS

[75] Inventors: Young-wook Park; Dae-rok Bae, both of Kyungki-do; Mun-han Park, Seoul, all of Rep. of Korea

[73] Assignee: Samsung Electronics Co., Ltd., Kyungki-do, Rep. of Korea

[21] Appl. No.: 563,082

[22] Filed: Nov. 27, 1995

[30] Foreign Application Priority Data

Mar. 8, 1995 [KR] Rep. of Korea ............... 1995-4715

[51] Int. Cl.⁶ ............................................. H01L 21/441
[52] U.S. Cl. ..................... 438/649; 438/659; 438/680; 438/683
[58] Field of Search .................... 437/195, 192, 437/193, 200, 228 SW, 240; 438/659, 649, 655, 683, 680

[56] References Cited

U.S. PATENT DOCUMENTS

| | | | |
|---|---|---|---|
| 4,782,033 | 11/1988 | Gierisch et al. | 437/56 |
| 4,818,723 | 4/1989 | Yen | 437/200 |
| 4,833,519 | 5/1989 | Kawano et al. | |
| 5,100,811 | 3/1992 | Winner et al. | 437/31 |
| 5,113,238 | 5/1992 | Wang et al. | |
| 5,231,052 | 7/1993 | Lu et al. | 437/190 |
| 5,355,010 | 10/1994 | Fujii et al. | 257/377 |
| 5,395,784 | 3/1995 | Lu et al. | 437/52 |
| 5,413,961 | 5/1995 | Kim | 437/195 |
| 5,420,074 | 5/1995 | Ohshima | 437/193 |
| 5,483,104 | 1/1996 | Godinho et al. | 257/758 |

FOREIGN PATENT DOCUMENTS

58-7865  1/1983  Japan .

OTHER PUBLICATIONS

Research Disclosure 320089 (Anonymous) "In–Site Boron Doped Tungsten Silicide . . . " (Mar. 1991).

"Phosphorus—Doped Molydenum Silicide for Low–Resistivity Gates and Interconnects" Inoue et al Japan Annual Reviews in Electronics, Computers, and Telecom, vol. 8 (1983) pp. 45–54.

S.– I Inoue, et al. "Phosphorus—Doped Molylidenum Silicide for Low–Resistivity, Gates and Interconnects" Scemicohductor Technologies, J. Nishizawa, ed.

North– Holland (Amsterdam)(1983) pp. 45–54. (Abstract Only).

*Primary Examiner*—Caridad Everhart
*Attorney, Agent, or Firm*—Cushman Darby&Cushman IP Group of Pillsbury Madison & Sutro LLP

[57] ABSTRACT

A manufacturing method for transistors wherein silicide is directed doped with a conductive impurity includes the steps of: forming a field oxide film defining an active region on a semiconductor substrate; forming transistors wherein a doped first silicide film is formed on gate electrodes on said active region; forming an interlayer dielectric film having contact holes on the whole surface of said semiconductor substrate; forming spacers on the innerwalls of each contact hole;p forming a thin doped polysilicon film on the whole surface of said semiconductor surface; and forming a doped second silicide film on the whole surface of said doped polysilicon film, filling each contact hole. The silicide film is directly doped with conductive impurity so that the conductive impurity of a polysilicon film can be prevented from being diffused to the outside. Therefore, the doped silicide film is useful to prevent the threshold voltage from increasing and the saturation current from reducing.

7 Claims, 5 Drawing Sheets

(CELL ARRAY REGION)

FIG. IA (PRIOR ART)
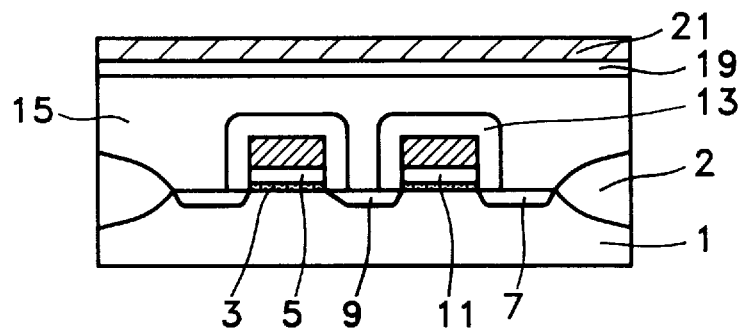
(CELL ARRAY REGION)
FIG. IB (PRIOR ART)
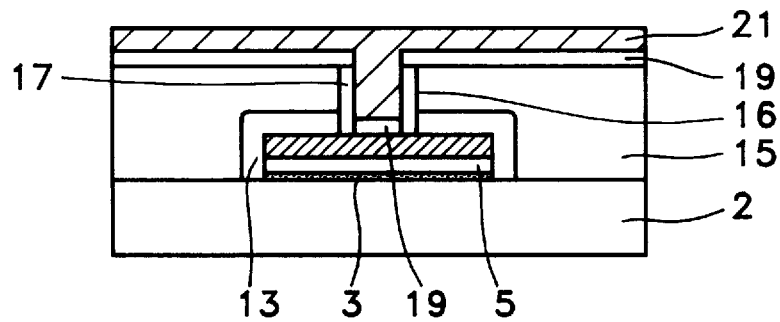
(PERIPHERY CIRCUIT REGION)

(CELL ARRAY REGION)

(CELL ARRAY REGION)

⊘ : $PH_3$를 이용하여 형성된 인(P)

MANUFACTURING METHOD OF TRANSISTORS

BACKGROUND OF THE INVENTION

The present invention relates to a manufacturing method for transistors in semiconductor devices. More particularly, the present invention relates to a manufacturing method for transistors in semiconductor devices formed of doped silicide.

When a metal film such as nickel is formed on a silicon substrate, a metal-silicon compound, silicide, is formed by mutual diffusion of atoms having lower thermodynamical free energy than the nickel has. The silicide has low resistance so that the silicide and the nickel can form a low-resistance contact.

Silicide is used during formation of memory cells, because the interface between the silicide and the silicon substrate can be flatly formed and the silicide can maintain stability even at high temperatures equal to or higher than 800° C. While forming the silicide, it is necessary to maintain an excellent vacuum state and to prevent contamination particles from flowing. Besides, the inflow of hydrocarbon or oxide during formation of the silicide makes harsh the interface between the silicide and the substrate. Silicide can be formed in two ways. One method is to form both a metal atom and a silicon atom together on a silicon substrate. The other method is to evaporate a metal film on the silicon substrate and then the silicide can be formed by thermal diffusion. Both methods require heat treatment, because in the former method the deposited metal atoms and silicon atoms first form in an amorphous state which can be changed into a polycrystalline state by appropriate heat treatment and in the latter method the heat treatment activates mutual diffusion of silicon atoms to form the silicide.

A potential barrier, called a Schottky barrier, is formed at the interface between the metal and the semiconductor. With the potential barrier, the metal film deposited on the semiconductor substrate doped in low concentration has current-voltage (I—V) properties almost identical to a p-n junction diode. The metal film deposited onto a semiconductor substrate doped in a high-concentration has an ohmic contact having linear I—V properties which generally have no impedance against current.

The usual polysilicon (P-Si) gate is replaced by a polycide gate to increase the operational speed of the semiconductor device. Having low linear resistance of no more than ¹/₂₀ of usual polysilicon, a polycide gate serves to increase the operational speed of the semiconductor device.

When polycide is used for forming a gate, however, phosphorus contained in the polysilicon, which is formed at the lower part of the silicide, diffuses into the silicide in the course of multiple steps of heat treatment after forming of the gate, resulting in a decrease of the amount of phosphorus in the polysilicon. This causes some problems in the property of transistor; the saturation current is reduced and the threshold voltage ($V_{th}$) is increased as shown in FIG. 2 and contact resistance is also increased (see Table 1).

TABLE 1 contact resistance of gate

|  | POLYSILICON GATE | TUNGSTEN POLYCIDE GATE |
| --- | --- | --- |
| CONTACT RESISTANCE (OHMS/CONTACT) | 426 | 1150 |

In order to solve the problems, an artificial implantation of impurity into the gate is under study (see:J JAP, 1984, VOL 23 No.7 PP. L493–L495, "Deposition of Phosphorus Doped Silicon Films by Thermal Decomposition of Disilane") but this has a high probability of affecting the gate oxide film at the lower part of the gate when the impurity is implanted. Therefore, a method in which phosphorus is doped when silicide is formed is necessary for fundamentally solving the problems.

FIGS. 1A and 1B show a semiconductor transistor manufactured by a conventional method. Semiconductor substrate 1 on which field oxide film 2 is formed is divided into an active region and an inactive region, then gate oxide film 3 is deposited on the active region. Further, polysilicon is formed on the whole surface of gate oxide film 3 and then a photoresist (not shown) is thinly coated. The photoresist is patterned to define the gate electrodes. The polysilicon is patterned according to the patterned photoresist which works as a mask. Conductive impurity is ion-implanted into the whole surface of the substrate having the patterned polysilicon (hereafter called a first conductive layer) so that source region 7 and drain region 9 are formed. After the photoresist pattern is removed, a pure metal is thinly deposited on the whole surface of first conductive layer 5 which is then heat treated. Accordingly, silicide 11 is formed at the interface between first conductive layer 5 and a pure metal by mutual diffusion of the metal atoms and silicon atoms forming first conductive layer 5. A gate protective film 13 is formed and patterned on the resultant structure. Further, an insulating film 15 having a contact hole 16 is formed on the whole surface in a periphery circuit region as shown in FIG. 1B; a doped polysilicon 19 and silicide 21 are sequentially formed on the whole surface of insulating film 15, filling contact hole 16. Then, the process is completed by a conventional method.

As described above, in the conventional transistor manufacturing method, silicide is formed by heat-treatment after a pure metal is deposited on the doped polysilicon. During the heat-treatment, the conductive impurity doped in the polysilicon is diffused into the silicide resulting in the reduction of the amount of conductive impurity doped in the polysilicon. Consequently, with the diffusion of the conductive impurity, the number of carriers in gate electrodes is reduced thereby reducing the saturation current and increase the threshold voltage.

SUMMARY OF THE INVENTION

Accordingly, it is an object of the present invention to provide a manufacturing method for transistors having doped silicide gate electrodes.

To accomplish the above object of the present invention, there is provided a manufacturing method for transistors comprising the steps of: forming a field oxide film defining an active region on a semiconductor substrate; forming transistors, in which a doped first silicide film is formed on gate electrodes, on the active region; forming an interlayer dielectric film having contact holes on the whole surface of the semiconductor substrate; forming spacers on the innerwalls of the contact hole; forming a thin doped polysilicon film on the whole surface of the semiconductor surface; and forming a doped second silicide film on the whole surface of the doped polysilicon film while the contact hole is filled.

According to the present invention, tungsten is used for the first and second silicide films. For the conductive impurity injected when the tungsten silicide is formed, phosphorus(P) generated during thermal decomposition of phosphine($PH_3$) or arsenic(As) generated during thermal decomposition of arsenic trihydride($AsH_3$) is used. The phosphine is decomposed at a temperature equal to or higher than 400° C. Accordingly, it is necessary to maintain the temperature equal to or higher than 400° C. in order to inject the phosphorus (P) into the silicide. According to the present invention, to form tungsten silicide where phosphorus(P) is doped, phosphine($PH_3$) is injected while $SiH_2Cl_2$ and $WF_6$ are deposited on the semiconductor substrate by Chemical Vapor Deposition (CVD) at a high-temperature of 520° C. To form the tungsten silicide, $SiH_2Cl_2$ of approximately 1–500SCCM, $WF_6$ of approximately 1–10SCCM and phosphine($PH_3$) of approximately 30–400SCCM are used. Inert gas such as argon(Ar) or helium(He) is used as the mixing gas. The first and second silicide films can be formed of one or more metal selected from a group consisting of tungsten, titanium, molybdenum, nickel and a cobalt. The silicide doped with a conductive impurity can be formed by concurrently injecting phosphine gas or arsenic trihydride ($AsH_3$) gas.

According to the present invention, the conductive impurity is directly doped to a silicide film so that the conductive impurity doped in the gate electrodes can be prevented from being diffused outside to avoid an increase of the threshold voltage and reduction of the saturation current in the gate electrodes.

BRIEF DESCRIPTION OF THE DRAWINGS

The above objects and advantages of the present invention will become more apparent by describing in detail a preferred embodiment thereof with reference to the attached drawings in which:

FIGS. 1A and 1B show a transistor manufactured by a conventional method;

DETAILED DESCRIPTION OF THE INVENTION

Figure 2:
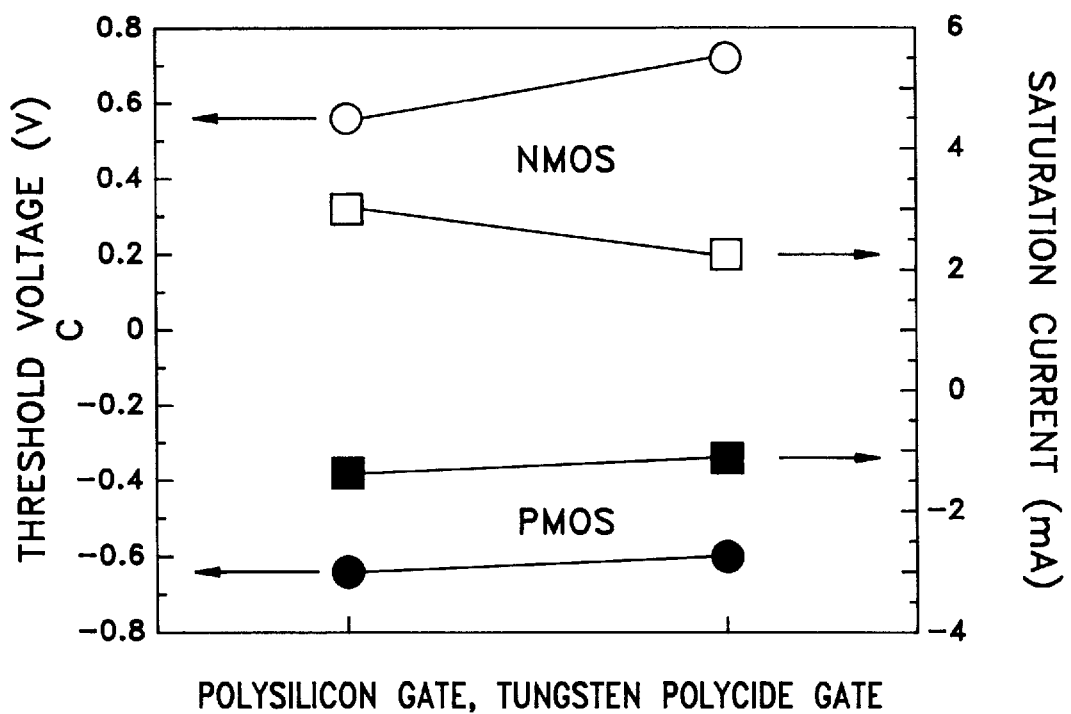
FIG. 2 is a graph showing comparison of the threshold voltage and the saturation current in a conventional gate formed of polysilicon and tungsten polycide.
Figure 3A:
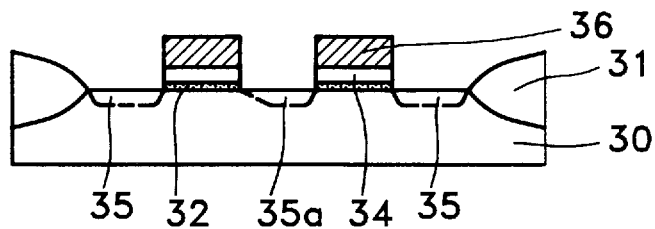
FIGS. 3A, 3B, and 3C show the steps of a semiconductor transistor manufacturing method according to the present invention.
Figure 3B:
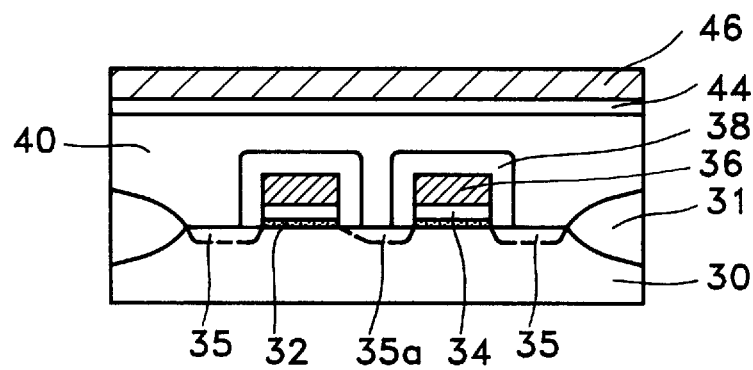

FIGS. 3A and 3B show the steps of a manufacturing method for transistors according to the present invention.

FIG. 3A shows the step of forming the first silicide. A nitride film ($Si_3N_4$;not shown) is deposited on semiconductor substrate 30 and then patterned to define an active region and an inactive region. The resultant structure is oxidized so that field oxide film 31 is thickly formed on the inactive region where the nitride film is removed. Further, the nitride film is removed from the active region and then gate oxide film 32 is formed on the semiconductor substrate having the resultant structure.

A gate polysilicon 34 doped with conductive impurity is deposited on gate oxide film 32. Next, a conductive impurity is ion-implanted onto the whole surface of the semiconductor substrate having the resultant structure, and thus a source region 35 and a drain region 35a are formed. Further, first silicide 36 doped with the same conductive impurity as that of the gate polysilicon is formed on gate polysilicon 34, thereby forming polycide gate electrodes.

Figure 5:
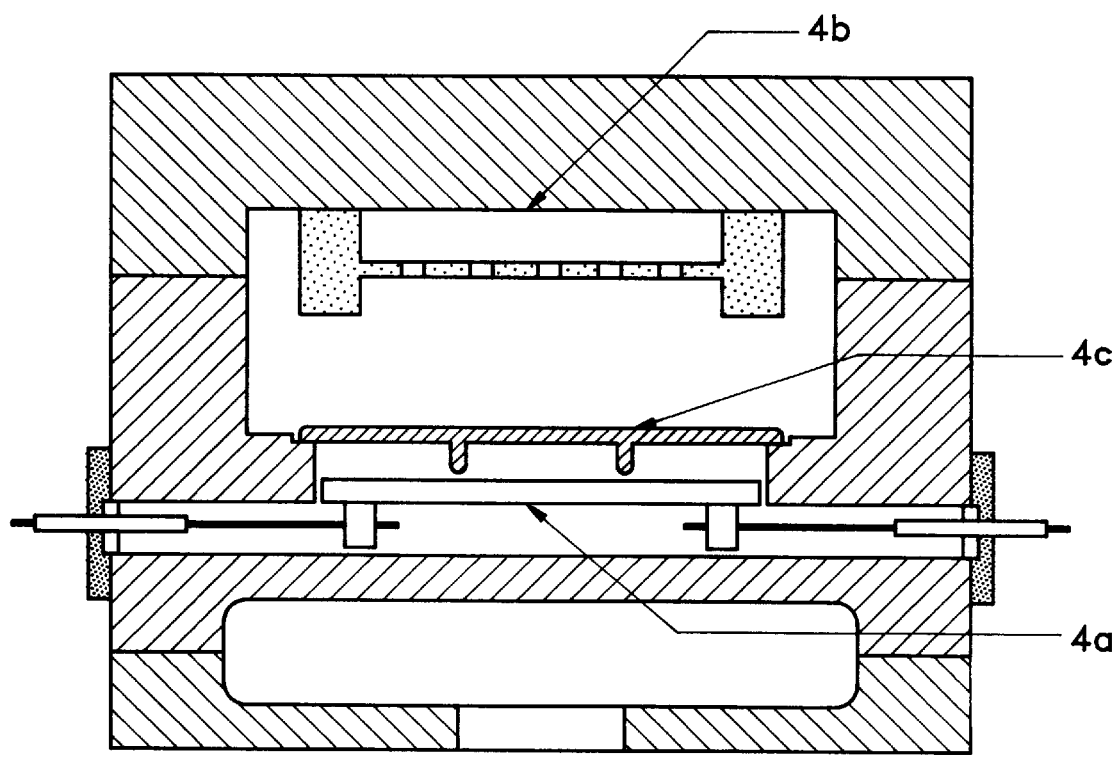
FIG. 5 shows the chemical vapor deposition (CVD) method used for the present invention.

A reaction chamber in a chemical vapor deposition (CVD) device used for forming not only the first doped silicide but also second doped silicide, as shown in FIG. 5, mainly includes exothermic resistor 4a for maintaining the reaction temperature, shower head 4b for supplying mixed gas and susceptor 4c for supplying a wafer. According to the present invention, exothermic resistor 4a is a plate type and mixed gas from outside is uniformly supplied to the reaction chamber through shower head 4b. Further, susceptor 4c mounted on exothermic resistor 4a is made of graphite to maintain the reaction temperature as well as support the wafer during gas reaction.

For the conductive impurity, phosphine($PH_3$) thermally decomposed at a high temperature or arsenic trihydride ($AsH_3$) can be used. The phosphine($PH_3$) can be decomposed into hydrogen and phosphorus(P) at high temperatures of about 400° C. Accordingly, a chemical reaction of the gas forming first silicide 36 doped with phosphorus occurs at a high temperature of 520° C. by using CVD. The first silicide is a tungsten silicide.

The silicide also can be formed by implanting phosphorus (P) of the phosphine($PH_3$) or arsenic (As) of arsenic trihydride ($AsH_3$) into one selected from the group consisting of nickel-, cobalt-, molybdenum-, and titanium-silicide.

The first tungsten silicide ($WSi_2$) doped with phosphorus (P) is formed by using $SiH_2Cl_2$ of 1–500SCCM, $WF_6$ of 1–10SCCM and phosphine of 30–400SCCM. Inert gas such as argon (Ar) or helium (He) is used as the mixing gas.

Figure 3C:
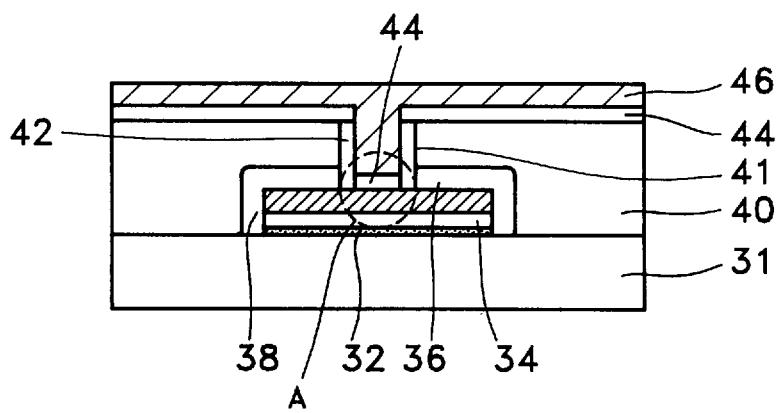

FIG. 3B shows the step of sequentially forming an insulating film having a contact hole, polysilicon for a bitline and a second silicide. An insulating film is deposited on semiconductor substrate 30 of FIG. 3A by CVD and then patterned, to thereby form gate insulating film 38. Then, interlayer dielectric film 40 having contact holes 41 is deposited on the whole surface of the resultant structure as shown in FIG. 3B. Contact holes 41 are formed on a part of first silicide 36 and then spacers 42 are formed on innerwalls of each contact hole 41 (see FIG. 3C). Further, polysilicon film 44 doped with phosphorus (P) is thinly deposited on the semiconductor substrate having the resultant structure, so that polysilicon film 44 doped with phosphorus (P) is thinly formed on a bottom surface of each contact hole 41, that is, on the first silicide. Second silicide 46 doped with phosphorus(P) is formed on the whole surface of polysilicon film 44, filling each contact hole 41. Thereafter, the process continues to complete transistors by a conventional method.

Figure 4A:
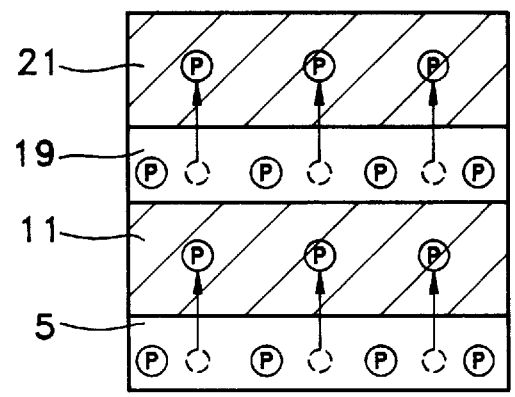
FIGS. 4A and 4B compare the physical states of the polycide manufactured by the conventional method and according to the present invention.
Figure 4B:
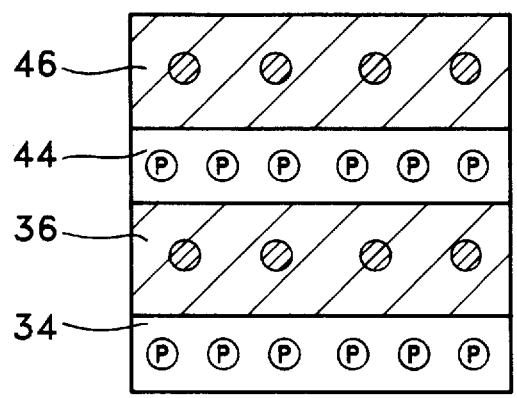

FIGS. 4A and 4B compare the physical states inside the polycide manufactured by the conventional method and by the present invention. More precisely, FIGS. 4A and 4B compare the physical states inside circle part "A" (shown by a dotted line in FIG. 3C). FIG. 4A shows that in the polycide structure forming a gate electrode line or bitline, the concentration of phosphorus (P) in polysilicon films 5 and 19 reduces owing to the out-diffusion of phosphorus implanted in the polysilicon films into upper silicide layers 11 and 21 during the heat-treatment of the usual CMOS process. The reduction of phosphorus in the polysilicon layers leads to undesirable results such as an increase of the threshold voltage and a reduction of the saturation current of the gate electrode.

FIG. 4B shows the polycide structure formed according to the present invention. First and second suicides 36 and 46 are doped with phosphorus(P) so that the phosphorus(P) of polysilicon films 34 and 44 are not out-diffused during the heat treatment of the subsequent process. Therefore, the concentration of phosphorus(P) in the polysilicon films is not changed.

As mentioned above, according to the present invention, a conductive impurity is directly doped to a silicide film. Accordingly, the conductive impurity in the polysilicon films which contacts with the doped silicide films can be prevented from being diffused to the silicide films. As a result, an increase of the threshold voltage and a reduction of the saturation current in the gate electrodes formed of polysilicon can be prevented. Besides, the contact resistance of contact holes is lowered so that the reliability of the semiconductor devices can be enhanced.

It should be understood that the invention is not limited to the illustrated embodiment and that many changes and modifications can be made by those of ordinary skill in the art which are within the scope of the invention.

What is claimed is:

1. A manufacturing method, comprising the steps of:

depositing a doped first silicide film to form a gate electrode of a transistor in an active region of a substrate;

forming an interlayer dielectric film over said substrate, and forming a contact hole to expose a portion of said doped first silicide film;

forming a doped polysilicon film on the exposed portion of said doped first silicide film; and depositing a doped second silicide film on said doped polysilicon film, wherein said doped first and second silicide films are doped by one of phosphine ($PH_3$) and arsenic trihydride ($AsH_3$).

2. A manufacturing method according to claim 1, wherein said doped first and second silicide films are formed by at least one selected from a group consisting essentially of tungsten-, titanium-, molybdenum-, nickel- and cobalt-silicide films.

3. The manufacturing method of claim 1, wherein a first doped polysilicon film is deposited prior to the step of depositing the doped first silicide, such that the gate electrode has a composite doped polysilicon, doped silicide structure.

4. The manufacturing method of claim 1, wherein spacers are formed on innerwalls of said contact hole.

5. The manufacturing method of claim 1, whereby said step of depositing a doped second silicide film fills said contact hole.

6. A manufacturing method, comprising the steps of:

forming a field oxide film defining art active region on a semiconductor substrate;

forming a gate of a transistor on said active region, said gate electrode being formed from a doped first silicide film;

forming an interlayer dielectric film over said substrate having a contact hole situated to expose at least a portion of said doped first silicide film of said gate of said transistor;

forming spacers on the innerwalls of said contact hole;

forming a thin doped polysilicon film on a surface of said semiconductor substrate and the exposed portion of said doped first silicide film; and forming a doped second silicide film on said doped polysilicon film to thereby fill said contact hole, wherein said doped first and second silicide films are doped by one of phosphine ($PH_3$) and arsenic trihydride ($AsH_3$).

7. A manufacturing method, comprising:

forming a doped polysilicon layer;

depositing a doped silicide film formed by chemical vapor deposition on said doped polysilicon layer; and patterning said doped polysilicon layer and said doped silicide film to form a gate electrode of a transistor in an active region of a substrate, wherein said doped silicide films are doped by one of phosphine ($PH_3$) and arsenic trihydride ($AsH_3$).

* * * * *